(12) United States Patent
Lee et al.

(10) Patent No.: US 10,154,594 B2
(45) Date of Patent: Dec. 11, 2018

(54) PRINTED CIRCUIT BOARD

(71) Applicant: SAMSUNG ELECTRO-MECHANICS CO., LTD., Suwon-si (KR)

(72) Inventors: Jeong-Ho Lee, Suwon-si (KR); Young-Do Kweon, Seoul (KR); Hyoung-Joon Kim, Daejeon (KR); Kyoung-Moo Harr, Jindo-gun (KR); Kyung-Seob Oh, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 135 days.

(21) Appl. No.: 14/871,357

(22) Filed: Sep. 30, 2015

(65) Prior Publication Data

US 2016/0316557 A1   Oct. 27, 2016

(30) Foreign Application Priority Data

Apr. 22, 2015   (KR) .................. 10-2015-0056524

(51) Int. Cl.
| | |
|---|---|
| *H05K 1/11* | (2006.01) |
| *H05K 3/00* | (2006.01) |
| *H05K 1/18* | (2006.01) |
| *H05K 3/40* | (2006.01) |
| *H01L 23/52* | (2006.01) |
| *H05K 3/46* | (2006.01) |

(52) U.S. Cl.
CPC .......... *H05K 3/0094* (2013.01); *H05K 1/181* (2013.01); *H05K 3/4046* (2013.01); *H01L 23/52* (2013.01); *H01L 2224/16225* (2013.01); *H05K 1/182* (2013.01); *H05K 1/186* (2013.01); *H05K 3/4694* (2013.01); *H05K 2201/09827* (2013.01); *H05K 2201/10189* (2013.01); *H05K 2201/10545* (2013.01); *Y02P 70/611* (2015.11)

(58) Field of Classification Search
CPC .......... H05K 1/14; H05K 1/141–1/144; H05K 1/186–1/188
USPC .................................. 361/760–767, 792–795
See application file for complete search history.

(56) References Cited

U.S. PATENT DOCUMENTS

| | | | |
|---|---|---|---|
| 9,155,205 B2* | 10/2015 | Huang | .................. H05K 3/225 |
| 9,351,410 B2* | 5/2016 | Nanjo | .................. H01L 21/486 |

(Continued)

FOREIGN PATENT DOCUMENTS

| | | |
|---|---|---|
| TW | 201306677 A1 | 2/2013 |
| TW | 201309128 A1 | 2/2013 |
| TW | 201427506 A | 7/2014 |

OTHER PUBLICATIONS

Taiwanese Office Action dated Apr. 30, 2018 in counterpart Taiwanese Patent Application No. 104132718 (26 pages, in Chinese with English translation).

*Primary Examiner* — Tuan T Dinh
(74) *Attorney, Agent, or Firm* — NSIP Law

(57) ABSTRACT

A printed circuit board including a circuit board having a cavity between an upper surface of the circuit board and a lower surface of the circuit board that are substantially parallel to each other, and a connection board including insulating layers substantially parallel with metal layers, the metal layers including metal patterns. The connection board is disposed in the cavity with the insulating layers and the metal layers of the connection board substantially perpendicular to the upper and lower surfaces of the circuit board.

11 Claims, 18 Drawing Sheets

(56) References Cited

U.S. PATENT DOCUMENTS

| | | | | |
|---|---|---|---|---|
| 9,462,697 B2* | 10/2016 | Chung | ............... | H05K 1/186 |
| 2007/0064375 A1* | 3/2007 | Urashima | ............... | H01G 2/06 361/311 |
| 2008/0247704 A1* | 10/2008 | Kodama | ............... | G02B 6/4204 385/14 |
| 2010/0163290 A1* | 7/2010 | Nagata | ............... | B32B 37/025 174/260 |
| 2012/0186861 A1 | 7/2012 | Shimizu et al. | | |
| 2012/0186866 A1 | 7/2012 | Mikado et al. | | |
| 2013/0003314 A1* | 1/2013 | Igarashi | ............... | H05K 3/4608 361/719 |
| 2013/0115411 A1* | 5/2013 | Kimura | ............... | H01G 4/005 428/105 |
| 2014/0037912 A1 | 2/2014 | Hasegawa et al. | | |
| 2014/0177177 A1 | 6/2014 | Huang et al. | | |

* cited by examiner

PRINTED CIRCUIT BOARD

CROSS-REFERENCE TO RELATED APPLICATIONS

This application claims the benefit under 35 USC 119(a) of Korean Patent Application No. 10-2015-0056524 filed on Apr. 22, 2015, in the Korean Intellectual Property Office, the entire disclosure of which is incorporated herein by reference for all purposes.

BACKGROUND

1. Field

The following description relates to a printed circuit board, a method of manufacturing the printed circuit board, and an electronic component module.

2. Description of Related Art

Recently, mobile devices and tablet PCs have become increasingly more functional and integrated as well as becoming smaller and lighter. Thus, the core components of these mobile devices, such as CPU, GPU and AP, have also become more functional and integrated. Various techniques and structures have been studied to reduce the size of the core components in order to implement package substrates having fine patterns with a pattern width of 3 µm or less. For instance, U.S. Patent Publication No. 2011/0103030 described an example of a technique for minimizing the size of core components.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a circuit board having a cavity, and a connection board including metal patterns, the connection board disposed in the cavity with the metal patterns disposed substantially vertically in the circuit board.

The metal patterns may be configured to provide an electrical connection between an upper surface and a lower surface of the circuit board.

The metal patterns may include signal lines for connecting a plurality of electronic components.

The metal patterns adjoining an upper surface of the circuit board may each have a different width from that of each of the metal patterns adjoining a lower surface of the circuit board.

The metal patterns disposed in the circuit board may each have a rectangular cross-sectional shape.

The circuit board may include a plurality of resin insulation layers, and the metal patterns are formed, respectively, on the plurality of insulation layers.

The connection board may have a rectangular prism shape.

The general aspect of the printed circuit board may further include connection patterns configured to interconnect the metal patterns formed on the plurality of the resin insulation layers.

The connection patterns may each have a circular cylindrical shape or a circular truncated cone shape.

The general aspect of the printed circuit board may further include a build-up layer including a build-up insulation layer and a build-up circuit layer on the circuit board having the connection board disposed therein.

The general aspect of the printed circuit board may further include a solder resist layer formed on the circuit board having the connection board disposed therein.

The general aspect of the printed circuit board may further include a resin filled between the connection board and the cavity.

The resin may include a solder resist.

In another general aspect, an electronic component module includes a printed circuit board including a circuit board having a cavity and a connection board including metal patterns, the connection board disposed in the cavity such that the metal patterns are disposed substantially vertically in the circuit board, and an electronic component mounted on the printed circuit board.

A plurality of electronic components may be mounted on an upper surface of the printed circuit board, and the plurality of electronic components may be electrically connected with one another through the metal patterns of the connection board.

The electronic component may include a first electronic component mounted on a lower surface of the printed circuit board, a second electronic component is mounted on an upper surface of the printed circuit board, and the first electronic component and the second electronic component are connected with each other through the metal patterns of the connection board.

In another general aspect, a method of manufacturing a printed circuit board involves obtaining a circuit board having a cavity, preparing a connection board including metal patterns, and disposing the connection board in the cavity such that the metal patterns of the connection board are disposed substantially vertically in the circuit board.

The preparing of the connection board may involve forming the metal patterns on a resin insulation layer through a circuit forming process, and fabricating the connection board by cutting the resin insulation layer having the metal patterns formed thereon into a predetermined size.

The circuit forming process may involve exposure, development and plating processes.

The general aspect of the method may further involve, after the disposing of the connection board in the cavity, laminating a build-up insulation layer and forming a build-up circuit layer on the build-up insulation layer through the circuit forming process.

The forming of the build-up circuit layer may involve forming connection patterns by forming vias interconnecting the metal patterns and the build-up circuit layer through the circuit forming process.

The general aspect of the method may further involve filling a resin between the connection board and the cavity.

In another general aspect, a method of manufacturing a printed circuit board involves inserting a connection board into a cavity of a circuit board, and the connection board includes conductor patterns that form an electrical connection across the circuit board.

The connection board may include an insulating member and the conductor patterns each disposed within or on the insulating member, the conductor patterns including signal lines for connecting a plurality of electronic components.

The general aspect of the method may further involve filling a resin between the cavity and the connection board.

The general aspect of the method may further involve forming a build-up layer on the circuit board having the connection board inserted therein.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
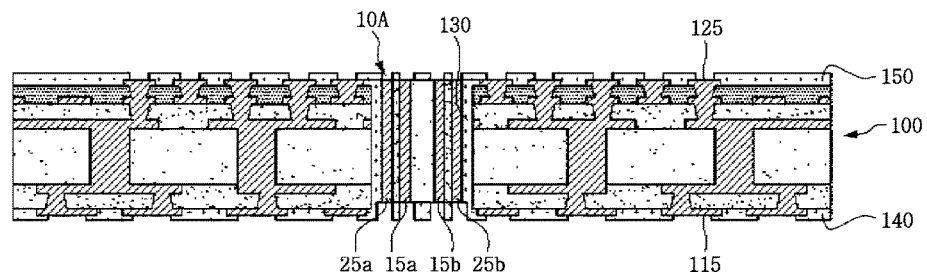
FIG. 1 is a cross-sectional view illustrating an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Hereinafter, certain embodiments of the present disclosure will be described in detail with reference to the accompanying drawings.

Printed Circuit Board

Figure 2:
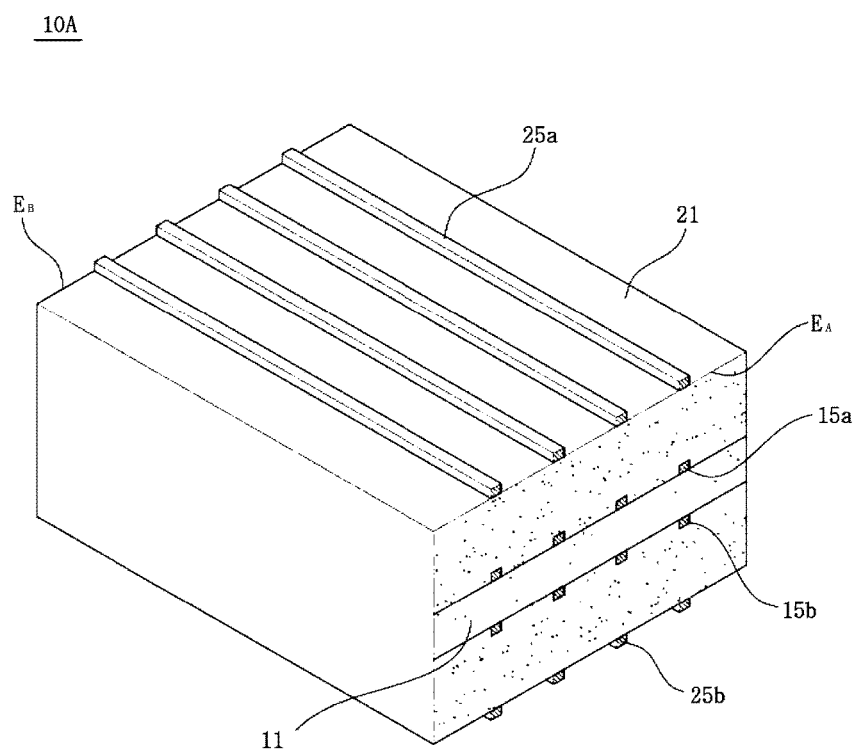
FIG. 2 is a perspective view illustrating an example of a connection board according to the printed circuit board shown in FIG. 1.
Figure 3:
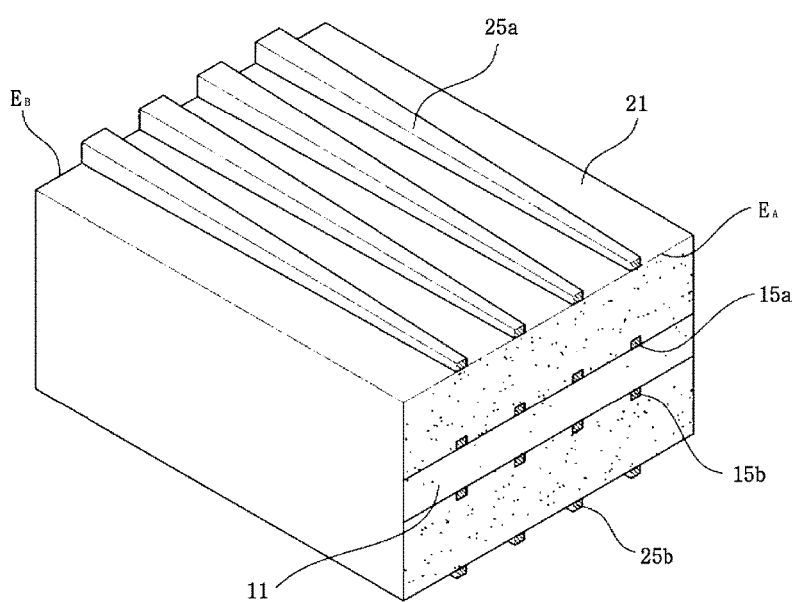
FIG. 3 is a perspective view illustrating another example of a connection board according to the printed circuit board shown in FIG. 1.
Figure 4:
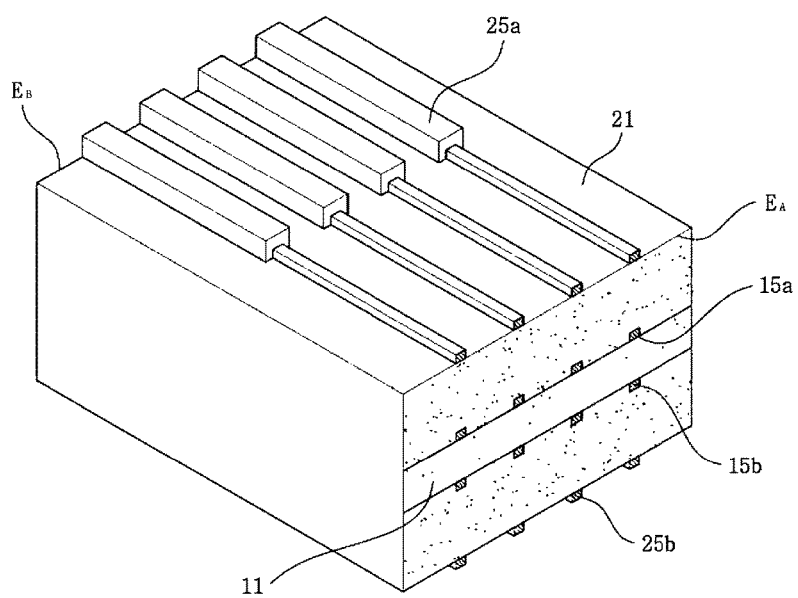
FIG. 4 is a perspective view illustrating yet another example of a connection board according to the printed circuit board shown in FIG. 1.

FIG. 1 illustrates a cross-sectional view of an example of a printed circuit board in accordance with the present disclosure, and FIG. 2 to FIG. 4 illustrate examples of connection boards that may be used in the example of the printed circuit board shown in FIG. 1.

Referring to FIG. 1, the printed circuit board includes a circuit board 100 and a connection board 10A placed within the circuit board 100 and penetrates through the circuit board 100.

In this example, the circuit board 100 is a multilayered printed circuit board that includes a plurality of circuit layers and an insulation layer interposed between the plurality of circuit layers for insulating the plurality of circuit layers from one another.

The circuit board 100 also includes a blind via and a through via for interlayer connection of the circuit layers.

The circuit layers include pads 115, 125 for connection with an external product, for example, an electronic component. In this example, the pads 115, 125 are disposed on two opposite sides of the circuit board 100. Thus, electronic components may be mounted on both sides of the circuit board 100. However, the present disclosure is not limited thereto; in another example, one or more electronic components may be mounted on one side of the circuit board 100.

Hereinafter, an example of the connection board 10A will be described with reference to FIG. 2.

Referring to FIG. 2, the connection board 10A includes a plurality of insulation layers 11, 21 and a plurality of metal patterns 15a, 15b, 25a, 25b formed on the plurality of insulation layers 11, 21.

In this example, the connection board 10A has a rectangular prism shape with a rectangular base. However, various modifications to the shape of the connection board 10A would be apparent to those skilled in the art, and such modifications are within the scope of the present disclosure; for instance, the connection board 10A may assume other three dimensional shapes such as a cylindrical shape with a circular or elliptical base, a triangular prism shape with a triangular base, a tapered pyramidal shape with a decreasing or increasing cross-sectional dimension, a cuboid shape with a square base and the like.

The metal patterns 15a, 15b, 25a, 25b may be extended from one edge of the connection board 10A, for example, an upper surface $E_A$, to an opposite edge, for example, a lower surface $E_B$. While the metal patterns 15a, 15b, 25a, 25b illustrated in FIG. 2 are arranged substantially parallel to each other, the present disclosure is not limited thereto. In another example, the metal patterns may form a complex arrangement within the connection board 10A or even merge and diverge as to form a network structure.

As illustrated in FIG. 1, in this example, the connection board 10A is received in such a way that the metal patterns 15a, 15b, 25a, 25b are disposed in a vertical direction of the circuit board 100.

The metal patterns 15a, 15b, 25a, 25b disposed in the vertical direction of the circuit board 100 may have a rectangular cross-sectional shape.

For instance, referring to the examples illustrated in FIG. 3 and FIG. 4, the metal patterns 15a, 15b, 25a, 25b may be designed in various shapes in such a way that a width thereof is greater at the lower surface $E_B$ than at the upper surface $E_A$.

In such a case, the metal patterns have finer pitches at the upper surface $E_A$, allowing a higher-density device or upper package to be mounted and allowing for an improved design freedom when applied to various product groups.

Figure 45:
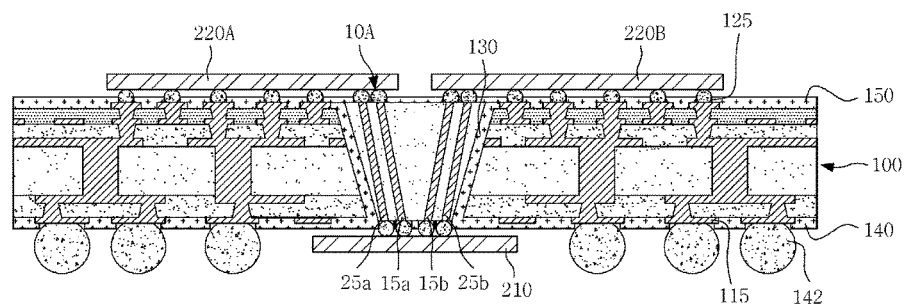
FIG. 45 is a cross-sectional view illustrating another example of a printed circuit board.
Figure 46:
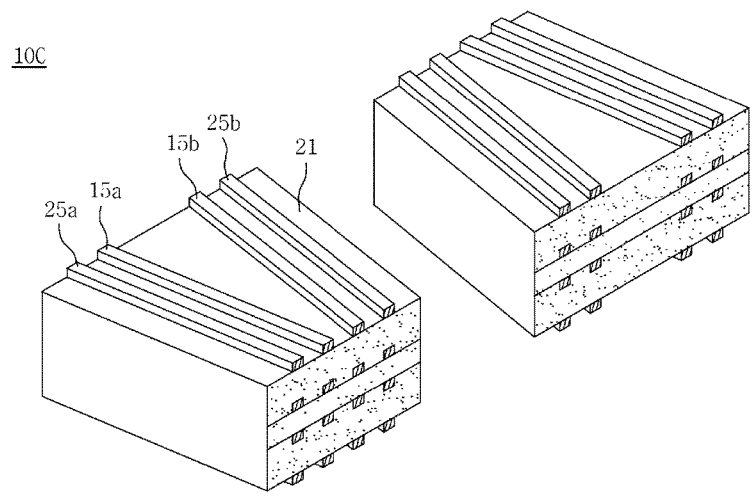
FIG. 46 is a perspective view illustrating an example of a connection board according to the printed circuit board shown in FIG. 45.

Further, the metal patterns 15a, 15b, 25a, 25b may have different distance from each other. According to an example illustrated in FIG. 46, the connection board 10C has a tapered exterior shape, and the metal patterns 15a, 15b, 25a, 25b are designed to be closer to each other at one side. Referring to FIG. 45, the metal patterns 15a, 15b, 25a, 25b of the connection board 10C establish an electrical connection between the upper and lower surfaces of the circuit board 100 in such a manner that exposed portions of the metal patterns 15a, 15b, 25a, 25b are spaced apart with a greater distance along the upper surface than along the bottom surface of the circuit board 100. According to one example, the pattern width between the metal patterns at the bottom surface of the circuit board may be between approximately 1 to 10 μm, 1 to 5 μm or 1 to 3 μm.

Referring to FIGS. 3 and 4, the metal patterns 15a, 15b, 25a, 25b may be formed through a circuit forming process including exposure, development and plating. For instance, the metal patterns 15a, 15b, 25a, 25b may be formed through any of common circuit pattern processes such as a semi additive process (SAP), a modified semi additive process (MSAP), an additive process and a subtractive process to have pitches of about 10-20 μm/10-20 μm.

Referring to FIG. 1, the metal patterns 15a, 15b, 25a, 25b illustrated in FIGS. 2 to 4 are disposed in the vertical direction of the circuit board 100 to function as an interconnection between an upper surface and a lower surface of the circuit board 100.

A through via formed in a substrate for connecting all layers commonly has a diameter of about 100 μm.

The metal patterns formed according to the examples illustrated in FIGS. 1 to 4 may be realized with a finer structure than the conventional via. As a result, it is possible to improve the design freedom and to reduce the size of the product and the number of layers necessary to implement the desired complexity.

The metal patterns 15a, 15b, 25a, 25b also includes signal lines for connecting a plurality of electronic components installed on the printed circuit board.

While a silicon interposer, fine patterns and/or other technologies are usually required for connection between electronic components, the illustrated examples allow forming a die-to-die connection by connecting a plurality of electronic components using a pattern of a common printed circuit board.

Furthermore, by allowing the electronic components to be connected not only side by side but also above and below the circuit board, the design freedom may be improved, and the package size may be reduced.

Exposed surfaces of the metal patterns 15a, 15b, 25a, 25b may function as pads for mounting a plurality of electronic components.

Moreover, it is also possible to form pads for mounting the plurality of electronic components through a process of forming an additional build-up circuit on the exposed metal patterns 15a, 15b, 25a, 25b.

The pads formed on the connection board 10A may have finer pitches than pads formed on the circuit board 100.

The circuit layers including the metal patterns used in the circuit board 100 and the connection board 10A may be made of any material that is used for a conductive material for a circuit in the field of printed circuit board. For example, the circuit layers may be made of copper (Cu).

The insulation layers used in the circuit board 100 and the connection board 10A may be made of any insulation resin used as an insulation material for common printed circuit boards, for example, thermosetting resin such as epoxy resin, thermoplastic resin such as polyimide, or any of these resins having a stiffener such as glass fiber or inorganic filler impregnated therein. For instance, the insulation layers may be made of a prepreg, an ajinomoto build-up film (ABF) or resin such as flame retardant 4 (FR-4) and bismaleimide triazine (BT).

A resin 130 may be filled between the circuit board 100 and the connection board 10A to affix the connection board 10A within the circuit board 100. The resin 130 may be made of solder resist or any material used as an interlayer insulation material for a common printed circuit board.

Additionally, a liquid type or film type of solder resist layers 140, 150 may be formed on outermost layers of the printed circuit board as protective layers exposing the metal patters 15a, 15b, 25a, 25b and the plurality of pads 115, 125.

The solder resist layers 140, 150 are formed for protection and electrical insulation of outermost layers of the circuit pattern and have openings formed therein in order to expose the pads 115, 125 on the outermost layers connected with an external product.

Moreover, a surface treatment layer may be selectively formed additionally on the metal patterns and the pads exposed through the openings of the solder resist layers.

The surface treatment layer may be formed through any method known to those skilled in the art such as, for example, electro gold plating, immersion gold plating, organic solderability preservative (OSP) or immersion tin plating, immersion silver plating, direct immersion gold (DIG) plating or hot air solder levelling (HASL).

The pads formed as described above may be used as pads for wire bonding, pads for bumps or pads for mounting external connection terminals such as solder balls.

Figure 5:
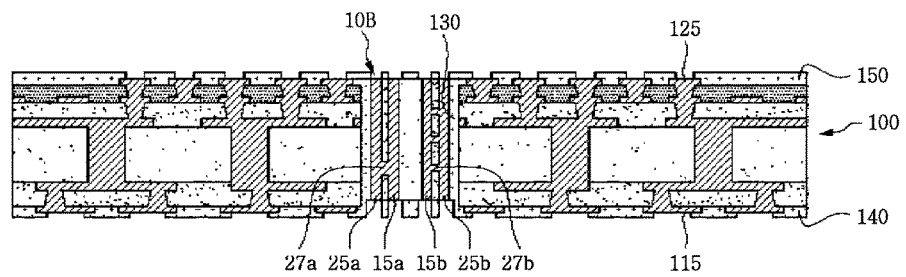
FIG. 5 is a cross-sectional view illustrating another example of a printed circuit board.
Figure 6:
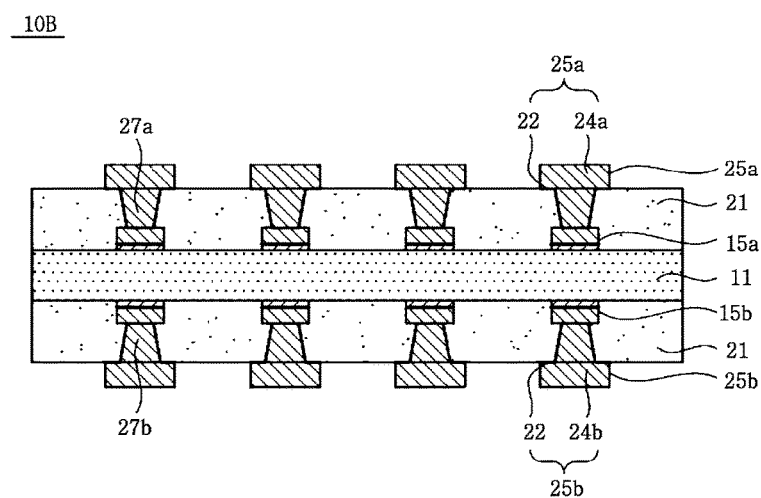
FIG. 6 is a cross-sectional view illustrating an example of a connection board according to the printed circuit board shown in FIG. 5.

FIG. 5 illustrates a cross-sectional view of another example of a printed circuit board in accordance with the present disclosure, and FIG. 6 illustrates a cross-sectional view of an example of a connection board shown in FIG. 5.

Referring to FIG. 5, the example of the printed circuit board includes a circuit board 100 and a connection board 10B placed through the circuit board 100.

The circuit board 100 is a multilayered printed circuit board that includes a plurality of circuit layers and a plurality of insulation layers interposed, respectively, between the plurality of circuit layers for insulating the plurality of circuit layers from one another.

The circuit board 100 also includes a blind via and a through via for interlayer connection of the circuit layers.

The circuit layers include pads 115, 125 for connection with an external product, for example, an electronic component.

Hereinafter, the connection board 10B will be described with reference to FIG. 6.

The connection board 10B includes a plurality of insulation layers 11, 21 and a plurality of metal patterns 15a, 15b, 25a, 25b formed on the plurality of insulation layers 11, 21.

In this example, the plurality of metal patterns 15a, 15b, 25a, 25b are interconnected by connection patterns 27a, 27b.

According to one example, the connection patterns 27a, 27b may be realized by a common circuit forming process. For example, the connection patterns 27a, 27b may be realized by forming a via hole in the insulation layer 21 through laser drilling or mechanical processing, and then by forming a via through electroless or electrolytic plating. Examples of steps of processing the connection patterns 27a, 27b will be described later.

The connection patterns 27a, 27b realized by a common via as described above may have a circular cylindrical shape or a circular truncated cone shape.

The metal patterns 15a, 15b, 25a, 25b of the connection board 10B are disposed in the vertical direction of the circuit board 100 to function as an interconnection between an upper surface and a lower surface of the printed circuit board.

The metal patterns 15a, 15b, 25a, 25b may include signal lines for connecting a plurality of electronic components installed on the printed circuit board.

While a silicon interposer, fine patterns and/or other technologies are usually required for connection between electronic components, the present example makes it possible to form a die-to-die connection by connecting a plurality of electronic components using a pattern of a common printed circuit board.

A resin 130 may be disposed between the circuit board 100 and the connection board 10B by filling a gap between the circuit board 100 and the connection board 10A with a resin, for example by an injection. The resin 130 may be made of solder resist or any material used as an interlayer insulation material for a common printed circuit board.

Additionally, a liquid type or film type of solder resist layers 140, 150 may be formed on outermost layers of the printed circuit board as protective layers exposing the metal patters 15a, 15b, 25a, 25b and the plurality of pads 115, 125.

Moreover, a surface treatment layer may additionally be formed selectively on the metal patterns and the pads exposed through openings of the solder resist layers.

The pads formed as described above may be used as pads for wire bonding, pads for bumps or pads for mounting external connection terminals such as solder balls.

Since the metal patterns in accordance with the illustrated example are disposed in the vertical direction of the circuit board to function as an interconnection between an upper surface and a lower surface of the circuit board and are formed through a common circuit forming process, it is possible to realize the metal patterns with a finer structure than the conventional via. As a result, it is possible to improve the design freedom and to reduce the size of the product and the number of layers required to implement desired complexity.

Figure 7:
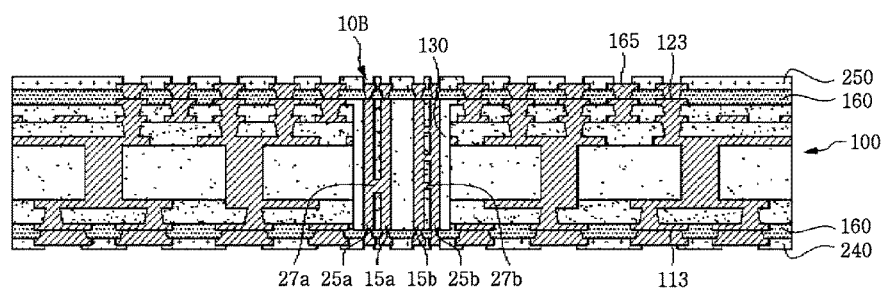
FIG. 7 is a cross-sectional view illustrating another example of a printed circuit board.

FIG. 7 illustrates a cross-sectional view of another example of a printed circuit board in accordance with the present disclosure.

Referring to FIG. 7, the printed circuit board includes a circuit board 100 and a connection board 10B placed through a cavity of the circuit board 100.

The circuit board 100 is a multilayered printed circuit board that includes a plurality of circuit layers and a plurality of insulation layers interposed, respectively, between the plurality of circuit layers for insulating the plurality of circuit layers from one another.

The circuit board 100 also includes a blind via and a through via for interlayer connection of the circuit layers.

The connection board 10B includes a plurality of insulation layers 11, 21 and a plurality of metal patterns 15a, 15b, 25a, 25b formed on the plurality of insulation layers 11, 21.

The plurality of metal patterns 15a, 15b, 25a, 25b are interconnected by connection patterns 27a, 27b.

The metal patterns 15a, 15b, 25a, 25b of the connection board 10B are received in the circuit board 100 in the vertical direction to function as an interconnection between an upper surface and a lower surface of the printed circuit board.

In this example, at least one build-up layer including a build-up insulation layer 160 and a build-up circuit layer 165 is formed on the circuit board 100 having the connection board 10B received therein.

Specifically, the at least one build-up layer including the build-up insulation layer 160 and the build-up circuit layer 165 is formed on circuit layers 123, 113 of the circuit board 100 and the exposed metal patterns 15a, 15b, 25a, 25b of the connection board 10B.

Moreover, the build-up circuit layer 165 includes pads for mounting a plurality of electronic components.

According to this example, the pads of the build-up circuit layer formed on the connection board 10B may have finer pitches than the pads of the build-up circuit layer 165 formed on the circuit board 100.

Additionally, a liquid type or film type of solder resist layers 240, 250 may be formed on outermost layers of the build-up circuit layer 165 as protective layers exposing the plurality of pads.

In this example, by forming at least one build-up layer on the circuit board 100 in which the connection board 10B is received, the freedom of design may be improved for products to which the illustrated printed circuit board may be applied.

Electronic Component Module

Figure 8:
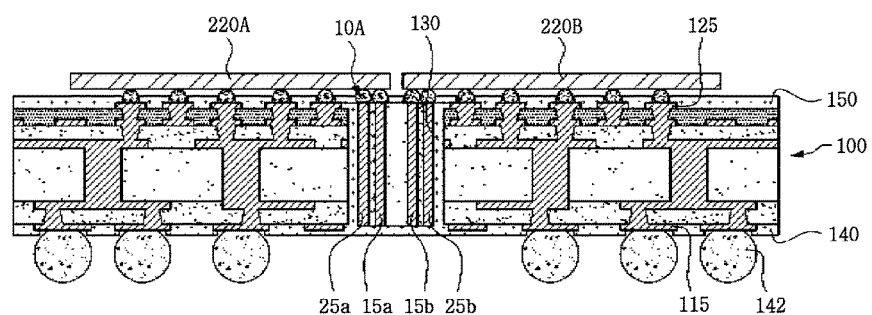
FIG. 8 is a cross-sectional view illustrating an example of an electronic component module.

FIG. 8 illustrates an example of a cross-sectional view of an electronic component module in accordance with the present disclosure.

Referring to FIG. 8, the electronic component module includes a plurality of electronic components 220A, 220B mounted on an upper surface of a printed circuit board.

The printed circuit board includes a circuit board 100 and a connection board 10A placed through the circuit board 100.

The circuit board 100 is a multilayered printed circuit board that includes a plurality of circuit layers and a plurality of insulation layers interposed, respectively, between the plurality of circuit layers for insulating the plurality of circuit layers from one another.

The circuit layers include pads 115, 125 for connection with the electronic components.

The pad 115 has an outside connection terminal 142, such as a solder ball, mounted thereon and is connected with an external product, for example, a main board (not shown), through the outside connection terminal 142.

Moreover, the plurality of electronic components 220A, 220B are mounted on the pad 125 through flip chip bonding.

The circuit board 100 also includes a blind via and a through via for interlayer connection of the circuit layers.

The connection board 10A includes a plurality of insulation layers 11, 21 and a plurality of metal patterns 15a, 15b, 25a, 25b formed on the plurality of insulation layers 11, 21.

The metal patterns 15a, 15b, 25a, 25b of the connection board 10A are received in the circuit board 100 in the vertical direction to function as an interconnection between an upper surface and a lower surface of the printed circuit board.

The metal patterns 15a, 15b, 25a, 25b include signal lines for connecting the plurality of electronic components 220A, 220B.

The electronic components 220A, 220B are mounted on the printed circuit board by being connected to the pads 125 of the circuit board 100 and to the exposed metal patterns 15a, 15b, 25a, 25b of the connection board 10A.

The electronic components 220A, 220B include various electronic devices, such as passive devices and active devices, may be any electronic devices as long as they can be mounted on or installed in a common printed circuit board.

The electronic components 220A, 220B may be interconnected with each other through the metal patterns 15a, 15b, 25a, 25b formed in the connection board 10A While a silicon interposer, fine patterns and/or other technologies are usually required for connection between electronic components, the plurality of electronic components may be connected through the illustrated metal patterns that are disposed in the vertical direction of a circuit board.

Moreover, since a pattern formed through a common circuit forming process is utilized as a vertical interconnection, it is possible to realize the interconnection with a finer structure than the conventional through via. As a result, it is possible to improve the design freedom and to reduce the size of the product and the number of layers to implement desired complexity.

Figure 9:
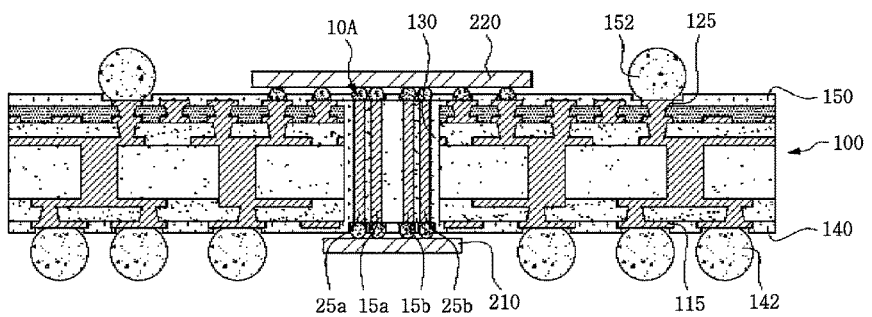
FIG. 9 is a cross-sectional view illustrating another example of an electronic component module.

FIG. 9 illustrates a cross-sectional view of an electronic component module in accordance with the present disclosure.

Referring to FIG. 9, the electronic component module includes electronic components 210, 220 mounted on a printed circuit board.

The printed circuit board includes a circuit board 100 and a connection board 10A placed through the circuit board 100.

The circuit board 100 is a multilayered printed circuit board that includes a plurality of circuit layers and a plurality of insulation layers interposed, respectively, between the plurality of circuit layers for insulating the plurality of circuit layers from one another.

The circuit layers include pads 115, 125 for connection with an external product, for example, an electronic component. The pads 115, 125 have outside connection terminals 142, 152, such as solder balls, mounted thereon and are connected with the electronic components 210, 220 and/or an external product, for example, a top/bottom package (not shown) or a main board (not shown), through the outside connection terminals 142, 152.

The connection board 10A includes a plurality of insulation layers 11, 21 and a plurality of metal patterns 15a, 15b, 25a, 25b formed on the plurality of insulation layers 11, 21.

The metal patterns 15a, 15b, 25a, 25b of the connection board 10A are received in the circuit board 100 in the vertical direction to function as an interconnection between an upper surface and a lower surface of the printed circuit board.

The metal patterns 15a, 15b, 25a, 25b include signal lines for connecting the plurality of electronic components 220, 220.

The electronic components 210, 220 are mounted on the printed circuit board by being connected to the pads 125 of the circuit board 100 and to the exposed metal patterns 15a, 15b, 25a, 25b of the connection board 10A.

The electronic components 210, 220 mounted, respectively, on the upper surface and the lower surface of the printed circuit board are connected with each other vertically through the metal patterns 15a, 15b, 25a, 25b.

The electronic components 210, 220 include various electronic devices, such as passive devices and active devices, may be any electronic devices as long as they can be mounted on or installed in a common printed circuit board.

While a silicon interposer, fine patterns and/or other technologies are usually required for connection between electronic components, in this example, the plurality of electronic components may be connected vertically through the illustrated metal patterns that are disposed in the vertical direction of a circuit board.

Moreover, since a pattern formed through a common circuit forming process is utilized as a vertical interconnection, it is possible to realize the interconnection with a finer structure than the conventional through via. As a result, it is possible to improve the design freedom and reduce the size of the product and the number of layers needed to implement the desired complexity.

Furthermore, the package size may be significantly reduced by connecting the electronic components vertically.

Method of Manufacturing Printed Circuit Board and Electronic Component Module

Figure 10:
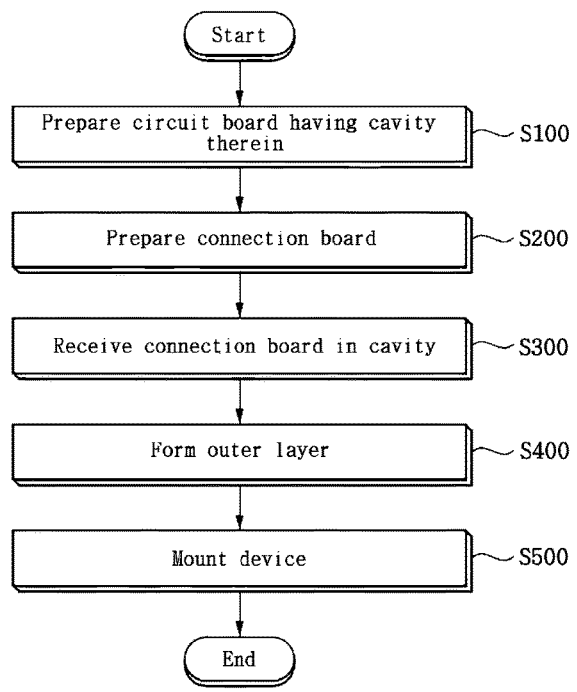
FIG. 10 is a flow diagram illustrating an example of a method of manufacturing a printed circuit board and an electronic component module including the printed circuit board.

FIG. 10 is a flow diagram showing an example of a method of manufacturing a printed circuit board and an electronic component module including such a printed circuit board, and FIG. 11 through FIG. 44 illustrate cross-sectional views describing the processes used in an example of a method of manufacturing an electronic component module.

Referring to FIG. 10, the example of the method of manufacturing a printed circuit board and an electronic component module including such a printed circuit board involves preparing a circuit board having a cavity therein (S100), preparing a connection board (S200), receiving the connection board in the cavity of the circuit board (S300), forming an outer layer (S400) of the circuit board and mounting a device (S500) on the circuit board. ect Hereinafter, each of the above processes will be described with reference to FIG. 11 through FIG. 44.

Figure 11:
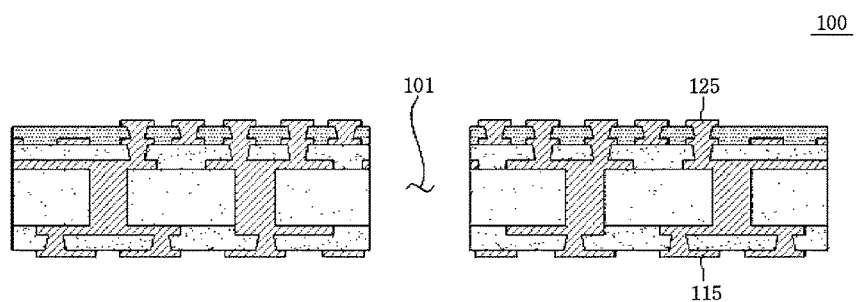
FIG. 11 through FIG. 44 illustrate processes used in an example of a method of manufacturing an electronic component module by illustrating cross-sectional views of the electronic component module during a manufacturing process.

Firstly, referring to FIG. 11, a circuit board 100 having a cavity 101 therein is prepared.

In this example, the circuit board 100 is a multilayered printed circuit board that includes a plurality of circuit layers and a plurality of insulation layers interposed, respectively, between the plurality of circuit layers for insulating the plurality of circuit layers from one another. The circuit board 100 may be prepared by using, for example, a substrate for a ball grid array (BGA).

The circuit board 100 includes a blind via and a through via for interlayer connection of the circuit layers.

The circuit layers include pads 115, 125 for connection with an external product such as, for example, an electronic component.

The cavity 101 of the circuit board 100 is a portion of the circuit board 100 that is perforated in order to embed the connection board 10A within the circuit board 100, and is formed in a size and a shape that allow the connection board 10A to be readily inserted therein. The cavity 101 may have, for example, a width or a length of approximately 10 μm to several millimeters; however, the size or the shape of the cavity 101 is not limited thereto. The cavity 101 may have, for example, a rectangular prism shape, a cylindrical shape, a cuboid shape, a tapered prism shape and the like.

The cavity 101 may be perforated using any known method, for example, mechanical drilling, laser drilling, and the like.

Figure 12:
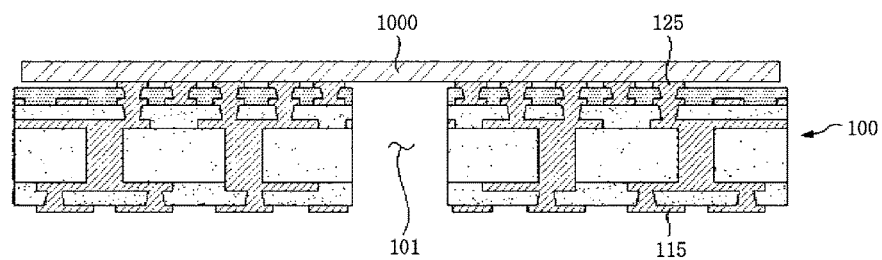

Then, referring to FIG. 12, a carrier film 1000 is attached to one surface of the circuit board 100.

The carrier film 1000 is a member that functions as a support on which the connection board 10A, which will be inserted later, may be positioned stably, and may be made of any material as long as it can function as the support and can be readily detached.

An example of a material that may be used as the carrier film 1000 is an adhesive material that loses adhesiveness when heat is applied thereto. When such a material is used, the substrate may be easily affixed to the carrier film 1000 and subsequently easily removed by performing a heat treatment. An example of the adhesive material that loses adhesiveness by a heat treatment includes, but not limited to, urethane foam tape.

Figure 13:
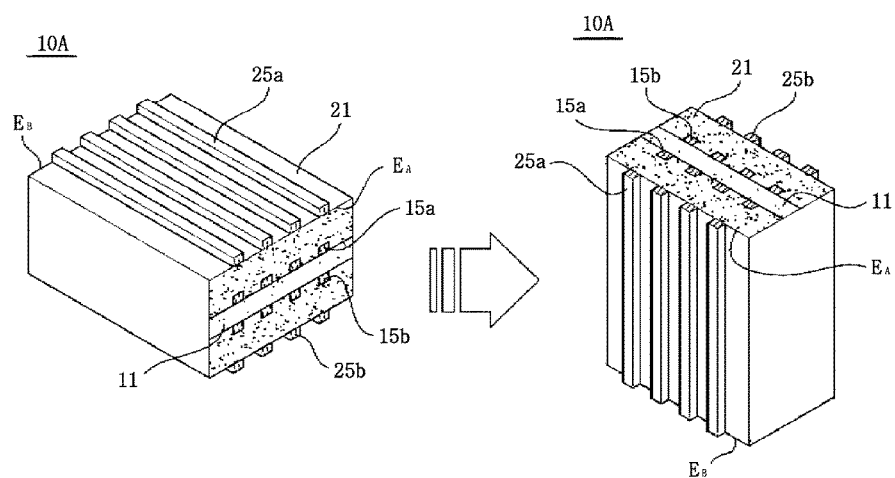

Next, as shown in FIG. 13, the connection board 10A is prepared.

The connection board 10A includes a plurality of insulation layers 11, 21 and a plurality of metal patterns 15a, 15b, 25a, 25b formed on the plurality of insulation layers 11, 21.

The metal patterns 15a, 15b, 25a, 25b of the connection board 10A may be formed through any of common circuit pattern processes, such as a semi additive process (SAP), a modified semi additive process (MSAP), an additive process and a subtractive process. The metal patterns 15a, 15b, 25a, 25b of the connection board 10A thus formed may have pitches of about 10-20 μm/10-20 μm.

The metal patterns 15a, 15b, 25a, 25b may be extended from an upper surface $E_A$ to a lower surface $E_B$ of the connection board 10A so as to function as an interconnection between an upper surface and a lower surface of the printed circuit board.

In the connection board 10A shown on the right-hand side of FIG. 13, the metal patterns 15a, 15b, 25a, 25b disposed vertically may each have a rectangular cross-sectional shape.

According to one example, the connection board 10A may be fabricated by severing an original plate on which metal patterns are formed, according to the size of the cavity 101.

Hereinafter, manufacturing processes of the connection board 10A using the MSAP and the SAP in accordance with an example according to the present disclosure will be described with reference to FIG. 14 through FIG. 26.

Figure 14:
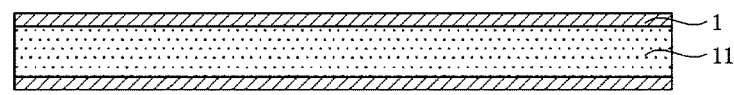

Firstly, referring to FIG. 14, an insulation layer 11 having metal layers 1 formed on either surface thereof is prepared.

Figure 15:
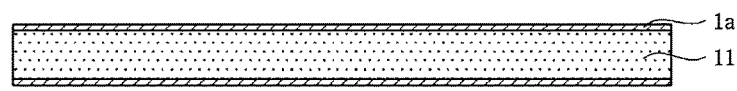

Then, referring to FIG. 15, the metal layers 1 are half-etched in a thickness direction thereof.

Figure 16:
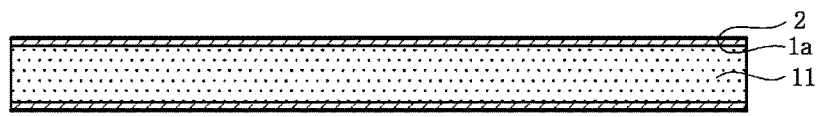

Next, referring to FIG. 16, seed layers 2 are formed on either surface of the half-etched metal layer 1a through electroless plating.

Figure 17:
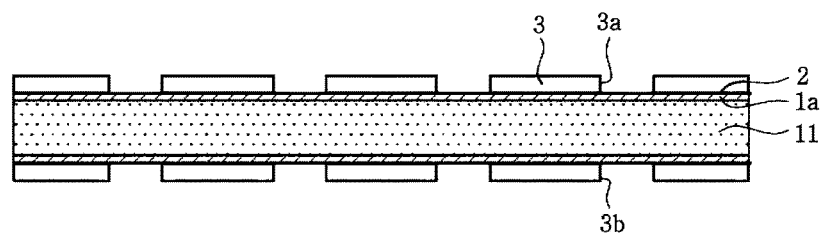

Then, referring to FIG. 17, plating resist layers 3 patterned to have openings 3a, 3b at locations where a circuit pattern is to be formed are formed on the seed layers 2.

Figure 18:
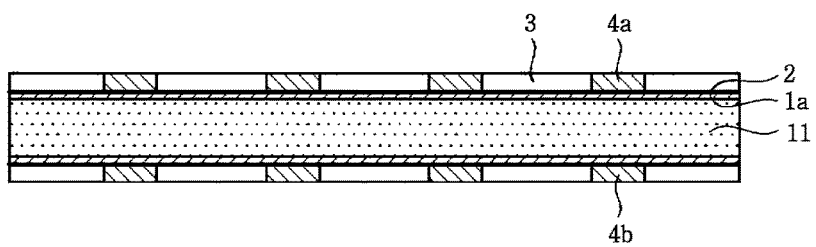

Then, referring to FIG. 18, pattern plating layers 4a, 4b are formed in the openings 3a, 3b through electrolytic plating.

Figure 19:
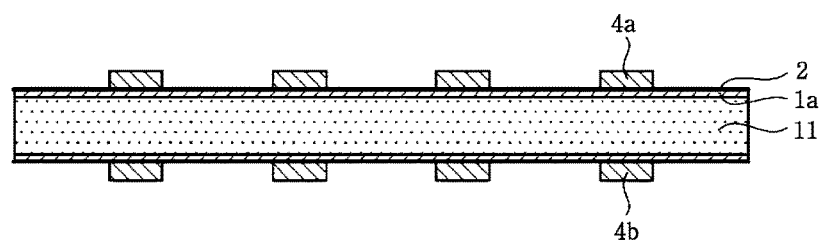
Figure 20:
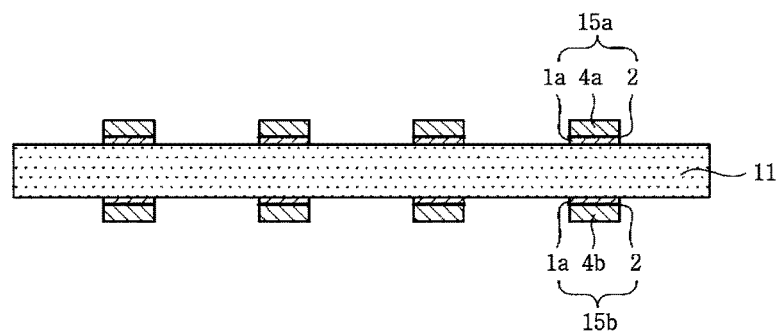

Next, the plating resist layers 3 are removed as shown in FIG. 19, and metal patterns 15a, 15b are formed by removing the seed layers and the metal layers through a common flash etching at unnecessary portions as shown in FIG. 20.

Figure 21:
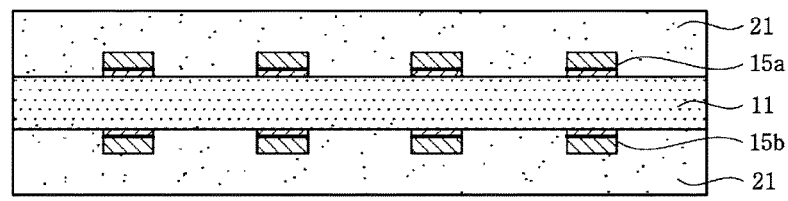
Figure 22:
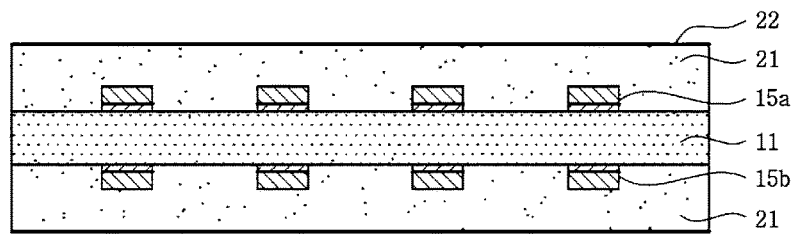

Then, referring to FIG. 21, build-up insulation layers 21 are laminated, and referring to FIG. 22, seed layers 22 are formed on the build-up insulation layers 21 through electroless plating. The seed layers 22 may be a thin film of a conductive metal, such as a thin copper film deposited on the build-up insulation layers 21.

Figure 23:
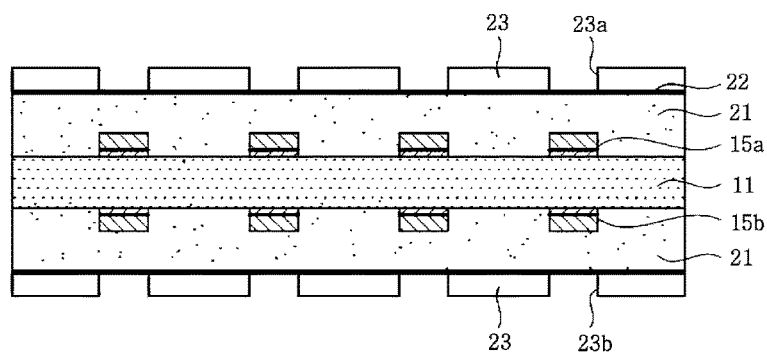

Next, referring to FIG. 23, plating resist layers 23 are formed on the seed layers 22 with a pattern that forms openings 23a, 23b at locations where the circuit pattern is to be formed.

Figure 24:
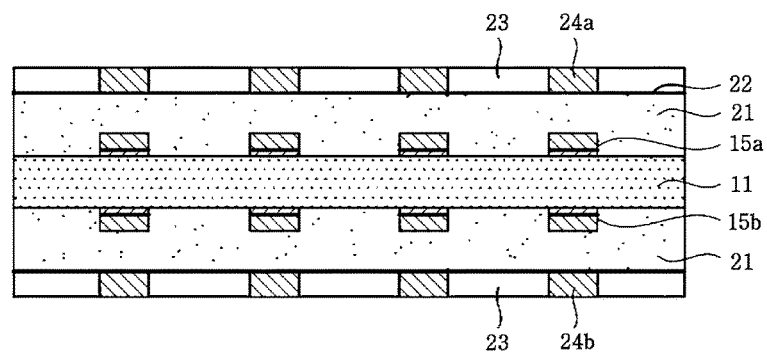

Afterwards, referring to FIG. 24, pattern plating layers 24a, 24b are formed in the openings 23a, 23b through electrolytic plating.

Figure 25:
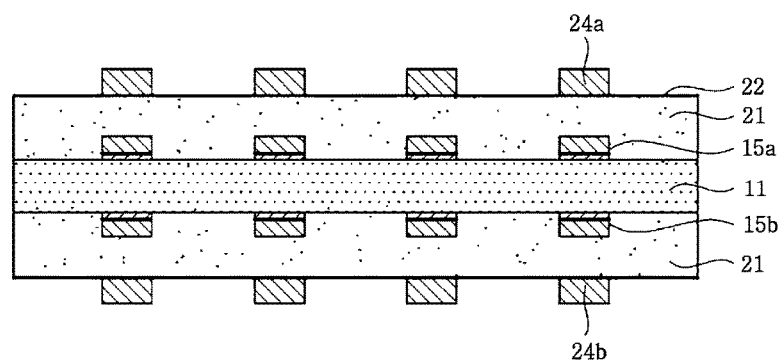
Figure 26:
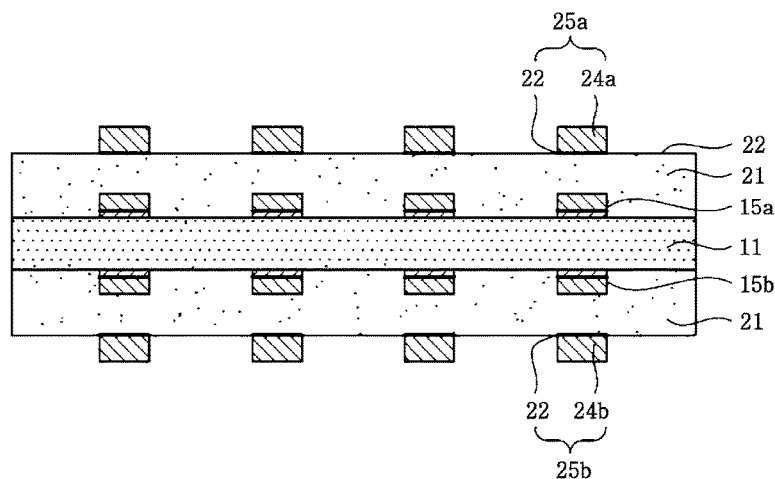

Thereafter, referring to FIG. 25, the plating resist layers 23 are removed, and as shown in FIG. 26, metal patterns 25a, 25b of build-up layers are formed by removing the seed layers through a common flash etching at unnecessary portions.

Hereinafter, manufacturing processes of a connection board 10B using the SAP in accordance with another example of the present disclosure will be described with reference to FIG. 27 through FIG. 39.

Figure 27:
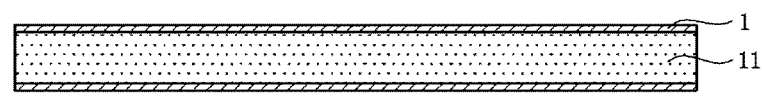

Firstly, referring to FIG. 27, an insulation layer 11 having metal layers 1 formed on either or both surface thereof is prepared.

Figure 28:

Then, referring to FIG. 28, seed layers 2 are formed on either or both surface of the metal layer 1 through electroless plating.

Figure 29:
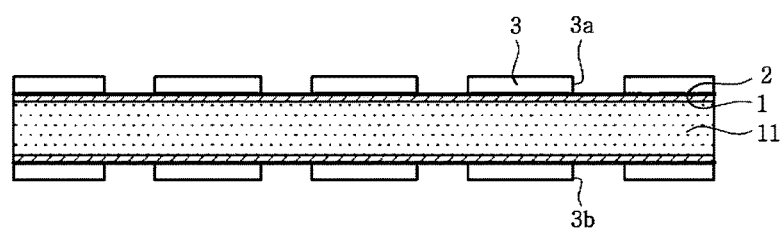

Then, referring to FIG. 29, plating resist layers 3 patterned to have openings 3a, 3b at locations where a circuit pattern is to be formed are formed on the seed layers 2.

Figure 30:
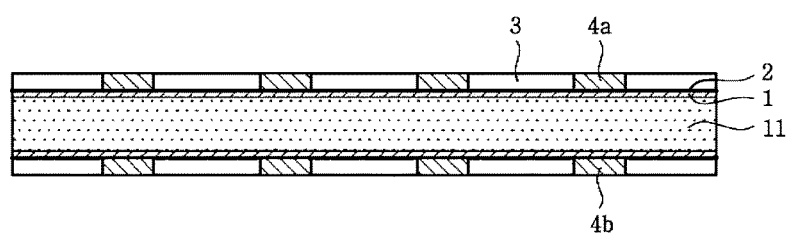

Then, referring to FIG. 30, pattern plating layers 4a, 4b are formed in the openings 3a, 3b through electrolytic plating.

Figure 31:
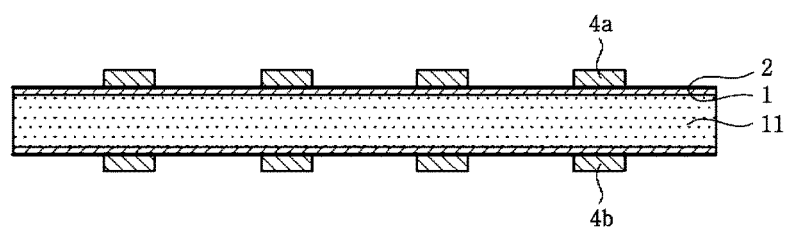
Figure 32:
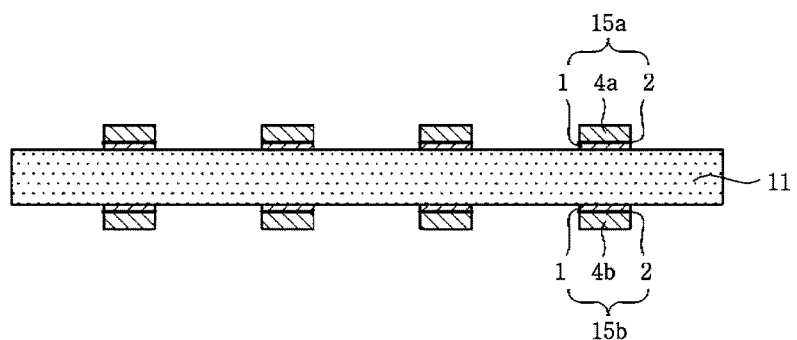

Next, the plating resist layers 3 are removed as shown in FIG. 31, and metal patterns 15a, 15b are formed by removing the seed layers and the metal layers through a common flash etching at unnecessary portions as shown in FIG. 32.

Figure 33:
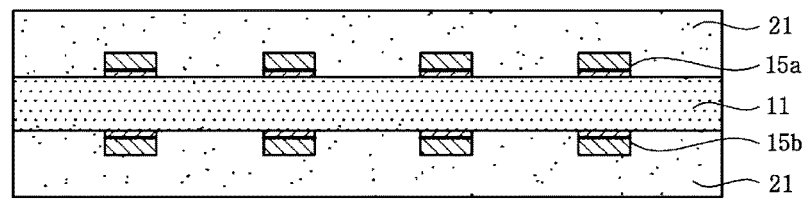
Figure 34:
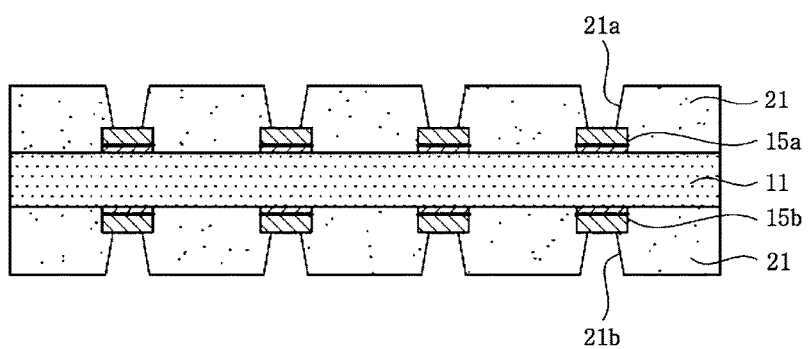

Then, referring to FIG. 33, build-up insulation layers 21 are laminated, and as shown in FIG. 34, via holes 21a, 21b for forming connection patterns are formed in the build-up insulation layers 21 through laser drilling.

Figure 35:
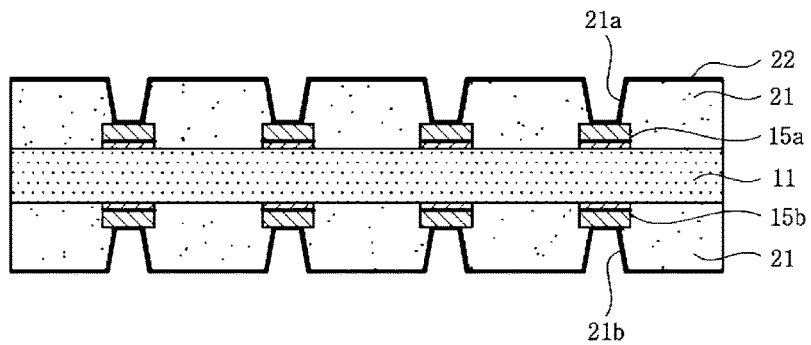

Then, referring to FIG. 35, seed layers 22 are formed through electroless plating on the build-up insulation layers 21 as well as inner walls of the via holes 21a, 21b.

Figure 36:
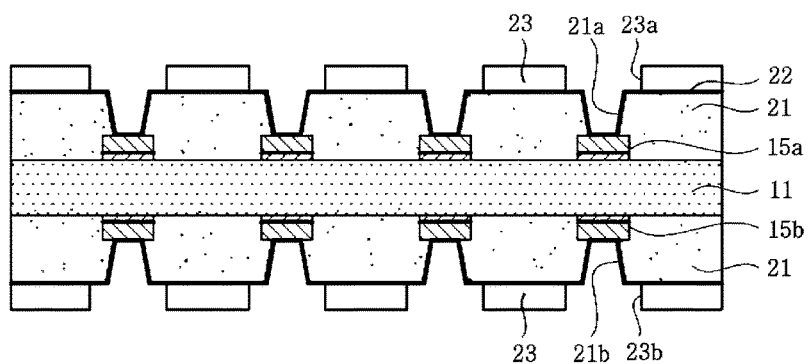

Afterwards, referring to FIG. 36, plating resist layers 23 are formed on the seed layers 22 with a pattern that forms openings 23a, 23b at locations where a circuit pattern is to be formed.

Figure 37:
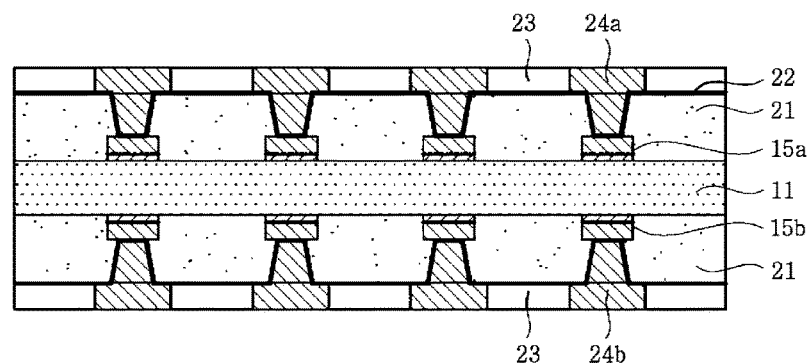

Then, referring to FIG. 37, pattern plating layers 24a, 24b are formed in the via holes 21a, 21b and the openings 23a, 23b through electrolytic plating.

Figure 38:
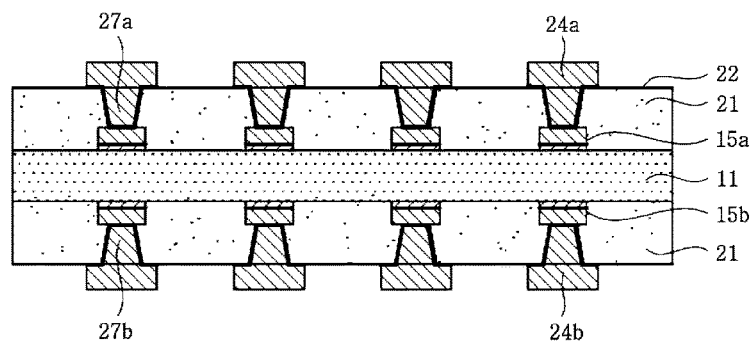
Figure 39:
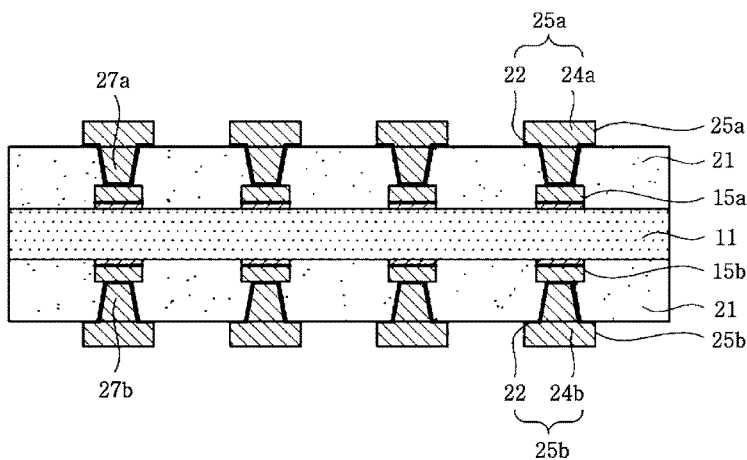

Next, referring to FIG. 38, the plating resist layers 23 are removed, and as shown in FIG. 39, metal patterns 25a, 25b of build-up layers are formed by removing the seed layers through a common flash etching at unnecessary portions.

According to one example, connection patterns 27a, 27b are obtained by forming vias that interconnect the metal patterns 15a, 15b and the metal patterns 25a, 25b of build-up layers.

Figure 40:
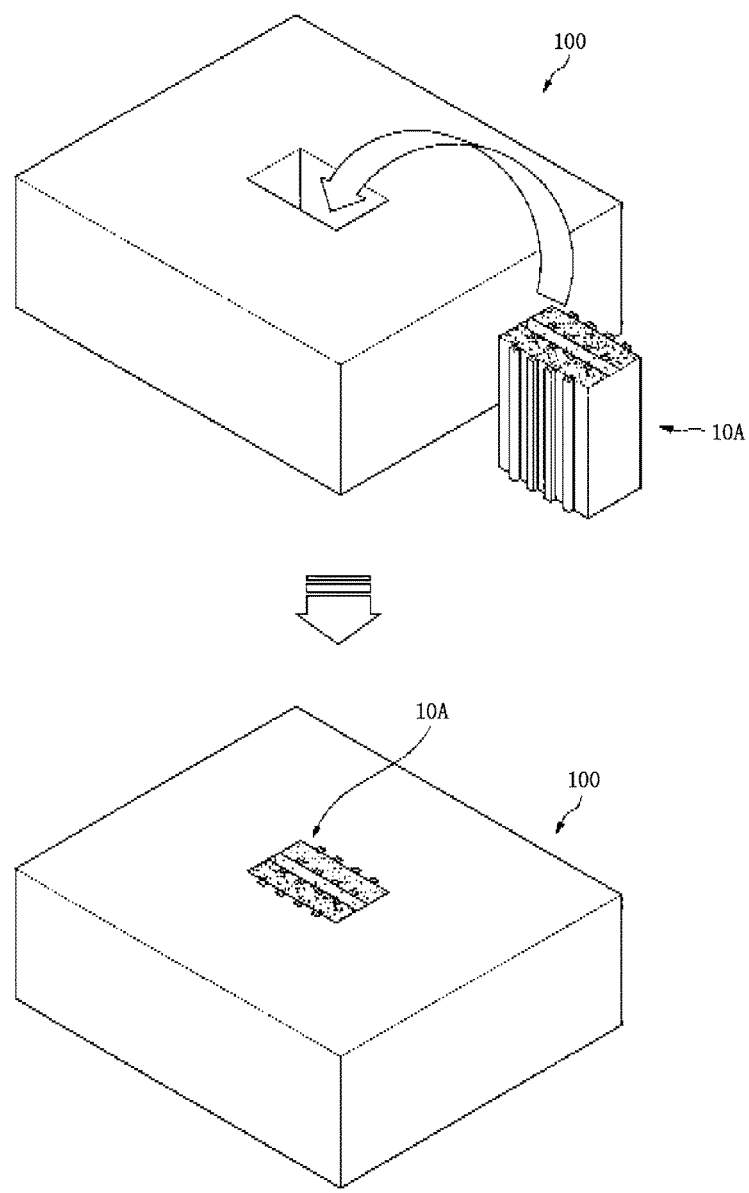
Figure 41:
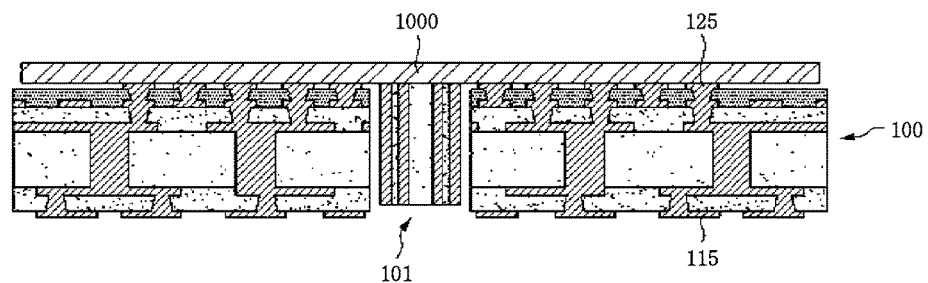

Afterwards, referring to FIG. 40 and FIG. 41, the above-described connection board 10A is inserted into the cavity 101 of the circuit pattern 100.

Referring to FIG. 40, the connection board 10A is positioned in the cavity 101 in such a way that the metal patterns 15a, 15b, 25a, 25b of the connection board 10A are vertically disposed in the circuit board 100.

Figure 42:
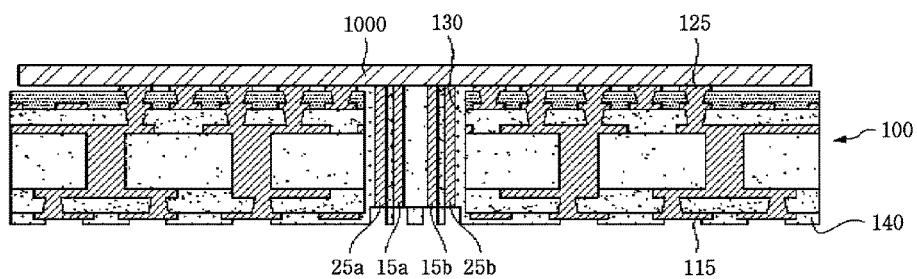

Then, referring to FIG. 42, a solder resist layer 140 is formed on the lower surface of the printed circuit board where the carrier film 1000 is not attached, and then openings are formed at portions of the solder resist layer 140 for exposing a plurality of pads 115 and the metal patterns 15a, 15b, 25a, 25b at portions to be used as pads.

In this example, a resin 130 is filled in a gap between the cavity 101 of the circuit board 100 and the connection board 10A to embed the connection board 10A within the cavity.

The filled resin 130 may be formed through a separate resin filling process or by filling solder resist in a gap while forming the solder resist layer on the outermost layer.

Although not illustrated herein, a build-up layer including a build-up insulation layer and/or a build-up circuit layer may additionally be formed, as necessary, prior to forming the solder resist layer 140.

Figure 43:
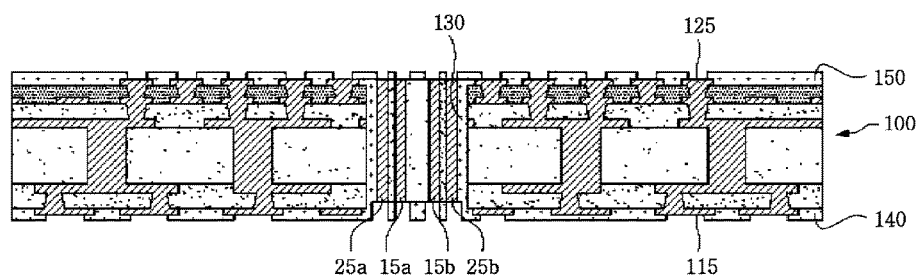

Next, referring to FIG. 43, the carrier film 1000 is removed, and then a solder resist layer 150 is formed on the upper surface of the printed circuit board. Then, openings are formed at portions of the solder resist layer 150 for exposing a plurality of pads 125 and the metal patterns 15a, 15b, 25a, 25b at portions to be used as pads.

Although not illustrated herein, a build-up layer including a build-up circuit layer and/or a build-up insulation layer may additionally be formed additionally, as necessary, prior to forming the solder resist layer 150.

A surface treatment layer may be selectively formed on the metal patterns and the pads exposed through the openings of the solder resist layer.

The pads formed as described above may be used as pads for wire bonding, pads for bumps or pads for mounting external connection terminals such as solder balls.

Figure 44:
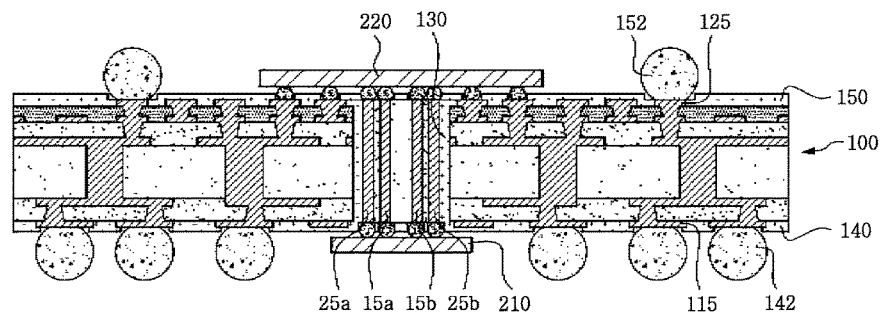

Afterwards, as shown in FIG. 44, devices, i.e., electronic components 210, 220 are mounted on either surface of the printed circuit board.

Outside connection terminals 142, 152, such as solder balls, are mounted on the pads 115, 125 for connection later with other electronic components and/or an external product, for example, a top/bottom package, a mother board or the like.

In this example, the electronic components 210, 220 are connected with each other vertically through the metal patterns 15a, 15b, 25a, 25b.

The metal patterns 15a, 15b, 25a, 25b may function as signal lines configured to connect the electronic components 210, 220 on the upper surface and the lower surface of the printed circuit board.

According to an example of the present disclosure, it is possible to connect a plurality of electronic components vertically through metal patterns disposed in a vertical direction of a circuit pattern.

Moreover, by utilizing a pattern formed through a common circuit forming process as a vertical interconnection, it is possible to realize the interconnection with a finer structure than the conventional through via, resulting in an improved design freedom and a reduced package size.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a circuit board comprising first insulating layers, first metal layers, and a cavity between an upper surface of the circuit board and a lower surface of the circuit board that are substantially parallel to each other; and
a connection board comprising second insulating layers substantially parallel with second metal layers, the second metal layers comprising metal patterns,
wherein the connection board is disposed in the cavity with the second insulating layers and the second metal layers of the connection board substantially perpendicular to the first metal layers and first insulation layers of the circuit board, and the second metal layers of the connection board extending from an upper surface to a lower surface of the connection board,
wherein the second metal layers of the connection board are connected to an electronic component to provide an electrical connection between the upper surface of the circuit board and the lower surface of the connection board.

2. The printed circuit board as set forth in claim 1, wherein the metal patterns of the connection board are configured to provide an electrical connection between the upper surface and the lower surface of the circuit board.

3. The printed circuit board as set forth in claim 1, wherein the metal patterns comprise signal lines for connecting a plurality of electronic components.

4. The printed circuit board as set forth in claim 1, wherein the metal patterns disposed in the connection board each have a rectangular cross-sectional shape.

5. The printed circuit board as set forth in claim 1, wherein the connection board comprises a plurality of resin insulation layers, and
the metal patterns are formed, respectively, on the plurality of insulation layers.

6. The printed circuit board as set forth in claim 1, wherein the connection board has a rectangular prism shape.

7. The printed circuit board as set forth in claim 1, further comprising a solder resist layer formed on the circuit board having the connection board disposed therein.

8. The printed circuit board as set forth in claim 1, further comprising a resin filled between the connection board and the cavity.

9. The printed circuit board as set forth in claim 1, further comprising a solder resist layer disposed on at least one of the upper surface and the lower surface, wherein ends of the metal patterns are exposed through the solder resist layer.

10. The printed circuit board as set forth in claim 8, wherein the resin comprises a solder resist.

11. A printed circuit board comprising:
a circuit board comprising first insulating layers, first metal layers, and a cavity between an upper surface of the circuit board and a lower surface of the circuit board that are substantially parallel to each other; and
a connection board comprising second insulating layers substantially parallel with second metal layers, the second metal layers comprising metal patterns, and the second metal layers extending from an upper surface to a lower surface of the connection board,
wherein the connection board is disposed in the cavity with the second metal layers of the connection board disposed at an angle converging with the upper and lower surfaces of the circuit board,
wherein the second metal layers of the connection board are connected to an electronic component to provide an electrical connection between the upper surface of the circuit board and the lower surface of the connection board.

* * * * *